United States Patent [19]

Meyers et al.

[11] Patent Number: 4,786,168

[45] Date of Patent: Nov. 22, 1988

[54] FREQUENCY DOMAIN LASER VELOCIMETER SIGNAL PROCESSOR

[75] Inventors: James F. Meyers, Newport News; John W. Stoughton, Virginia Beach; James I. Clemmons, Jr., Newport News; Sharad V. Kanetkar; Andreas E. Savakis, both of Norfolk, all of Va.

[73] Assignee: The United States of America as represented by the United States National Aeronautics and Space Administration, Washington, D.C.

[21] Appl. No.: 933,941

[22] Filed: Nov. 24, 1986

[51] Int. Cl.[4] ............... G01P 3/36; G01R 23/02; G01R 23/16

[52] U.S. Cl. ............... 356/28.5; 324/77 R; 324/77 E; 324/78 D; 324/78 F; 364/484; 377/39

[58] Field of Search ............... 356/28.5; 324/77 A, 324/77 R, 77 E, 78 D, 78 F, 78 R, 77 D; 342/115; 364/484; 377/10, 39

[56] References Cited

U.S. PATENT DOCUMENTS

| | | |
|---|---|---|
| 3,167,738 | 1/1965 | Westerfield . |
| 3,621,391 | 11/1971 | Miller ............... 377/39 X |
| 3,683,345 | 8/1972 | Faulkes et al. ............... 377/39 X |
| 3,701,149 | 10/1972 | Patton et al. . |
| 3,738,750 | 6/1973 | Kalb et al. . |
| 3,805,171 | 4/1974 | Drumheller ............... 324/78 D X |
| 3,912,915 | 10/1975 | Kalb et al. . |
| 3,982,101 | 9/1976 | Kalb et al. . |
| 4,179,218 | 12/1979 | Erdmann et al. . |
| 4,227,055 | 10/1980 | Hanson ............... 364/484 |
| 4,385,208 | 5/1983 | Tow ............... 364/484 |
| 4,506,979 | 3/1985 | Rogers ............... 356/28.5 |
| 4,577,963 | 3/1986 | Trainia . |
| 4,610,540 | 9/1986 | Mossey ............... 356/28.5 |

Primary Examiner—Stephen C. Buczinski
Assistant Examiner—Linda J. Wallace
Attorney, Agent, or Firm—Harold W. Adams; John R. Manning; Charles E. B. Glenn

[57] ABSTRACT

A laser velocimeter signal processor for measuring the signal frequency within a signal burst. The input signal is converted to digital by an ADC 16 and then shifted into shift registers 30 and 31. An automatic gain circuit 15 controls the gain of the input signal. A signal integration circuit 32 determines when a signal burst has been captured by the shift registers and and then transfers the contents of the registers to data latches 33 and 34. The data in data latches 33 and 34 is processed by digital bandpass filters 57–63, square law detectors 64–70, burst counters 71–77 and signal processor 78 to determine the frequency of the signal within the captured signal burst.

27 Claims, 3 Drawing Sheets

FREQUENCY DOMAIN LASER VELOCIMETER SIGNAL PROCESSOR

ORIGIN OF THE INVENTION

The invention described herein was made jointly in the performance of work under NASA Contract No. NAS1-17993 with the Old Dominion University Research Foundation and employees of the U.S. Government. In accordance with 35 USC 202, the contractor elected not to retain title.

BACKGROUND OF THE INVENTION

The invention relates generally to laser velocimetry and more specifically concerns a signal processor for measuring the oscillating frequency contained in a laser velocimeter signal burst or bursts.

A laser velocimeter is a non-intrusive instrumentation system that is used to measure the velocity of small particles embedded within a fluid flow field. The transmission optical system divides a single laser beam into two equal-path-length beams and focuses these beams so they cross at a point within the flow field. Since laser light is monochromatic and coherent, a fringe pattern will be formed within the sample volume at the cross-over point. As a small particle passes through the fringe pattern, it will scatter light whose intensity will oscillate as the particle passes through the alternating light and dark regions of the fringe pattern. A portion of this scattered light is collected by a receiver which directs the collected light to the photocathode surface of a photomultiplier. The photomultiplier converts the optical signal to an electronic signal. The output electronic signal is composed of a collection of Poisson distributed photo-electrons whose average occurrence rate is proportional to the instantaneous light intensity at the photocathode. As the intensity increases from the photon resolved regime, i.e., one photon per response time of the photomultiplier, the additional photon arrivals within the response time add voltage to the output signal. With sufficient photons, the signal approaches a Gaussian shaped signal burst containing the oscillation frequency. A measurement of the oscillation frequency is multiplied by the distance between adjacent fringes to yield the velocity of the particle.

The primary goal of a signal processing technique is to determine the oscillation frequency contained within a signal burst. In the past there have been three techniques used to determine this oscillation frequency. These three techniques are referred to as the frequency tracking technique, the high-speed burst counter technique and the photon correlator.

The approach used in the frequency tracker technique for the measurement of the oscillation frequency is based on the technology used in an FM radio receiver. The input signal frequency is electronically mixed with a signal from a reference oscillator (usually a voltage controlled oscillator, VCO) to yield a difference frequency located within the bandwidth of an electronic frequency discriminator (frequency to voltage converter). When the reference oscillator frequency is properly set, the average output signal obtained from the discriminator is zero volts and the instantaneous output voltage represents the demodulated FM signal. If the discriminator output is low pass filtered and used as a nulling control signal in the adjustment of the reference oscillator frequency, an automatic frequency control (AFC) circuit is obtained which locks in the radio signal removing the effect of frequency drift. This principle is used in the frequency tracker to follow slow changes in the average signal frequency which result from flow field drift or scanning of the measurement volume within the flow field. This control signal becomes the output signal representing the average flow velocity. The discriminator output represents the instantaneous signal frequency about the average. A weakness of the frequency tracker becomes evident when applied to sparsely seeded gas flow fields. If the duty cycle (percentage of time a signal is present) begins to decrease, the null output from the discriminator (when a signal is not present) decreases the effectiveness of the feedback loop to respond to real changes in the flow velocity due to time weighting of the null signal. If the velocity changes are great enough to leave the bandwidth of the discriminator, e.g., moving the sample volume from a boundary layer to free stream, the signal is lost and cannot be recovered without a full range sweep of the VCO. This bandwidth limit of the discriminator has the second effect of limiting the ability of the frequency tracker to measure flow fields with large turbulence intensities. For example, if the average signal frequency is 20 MHz with a ten percent turbulence intensity, a bandwidth of three standard deviations or twelve MHz (three times ±2 MHz), is required for an accurate measurement. Since discriminators typically have a 1.0 MHz bandwidth, the results from the frequency tracker for this example would be considerably in error.

The approach used in the high-speed burst counter technique is much simpler than the tracker: determine when a signal burst is starting, determine when the pedestal removed signal crosses zero volts, determine when the signal crosses zero volts n times later, and output the number of reference clock pulses which occurred during the time for n zero crossings. The technique begins by bandpass filtering the incoming signal to remove the pedestal voltage (high pass section) and increase signal-to-noise by limiting the noise bandwidth (low pass section). The filtered signal then passes through a double threshold/zero detector circuit which converts it to a square wave signal. This signal controls digital logic establishing the gating control signal for circuits which count pulses from the reference clock. Various techniques are then used to validate signals matching the "typical" laser velocimeter signal signature, e.g., 5:8 count comparison. The number of reference clock pulses counted are then output in a digital format to the data acquisition system. The advantages of the high-speed burst counter are: measurement is completed during the signal burst, output only obtained when a measurement has been made, measurements are independent of previous history, and the time of occurrence may be determined. The disadvantages are the effects of signal-to-noise on the determination of the first and $n^{th}$ zero crossings and quantizing of time by the reference clock yields a residual f'/F (standard deviation of signal frequency divided by the average signal frequency), and serious measurement errors are possible if the filter and threshold settings are chosen improperly.

The operation of the photon correlator is simpler yet. The input signal is autocorrelated for the measurement time and the results sent to the data acquisition system. To increase the speed of the instrument and thus the range of input signal frequencies, the input signal is discriminated by a single comparator to yield a pulse train allowing single bit correlation. This method simplifies the multiplying circuits to a series of logic AND gates. The advantage of this technique is that correlation of the signal will increase the signature of the "average" signal burst while removing the uncorrelated photomultiplier shot noise. The disadvantages of this technique are that only the "average" frequency can be measured, flow turbulence decreases the number of cycles in the correlation function thereby decreasing accuracy, and the discriminator level must be set based on the amplitude of the signal bursts to minimize the effect of noise on the correlation function.

An object of this invention is to provide a signal processing technique that has the ability to follow the average signal frequency variations (automatic frequency control) and maintain a constant signal level (automatic gain control) like the frequency tracker, measure the signal frequency during the signal burst like the high-speed burst counter, and be virtually independent of input signal-to-noise ratio like the photon correlator.

Another object of this invention is to provide a signal processing technique without opeator intervention.

A further object of this invention is to use a non-linear analog-to-digital converter for signal amplitude compression thereby reducing the occurrences of missing cycles during digitization of signal bursts with low visibility.

Yet another object of this invention is to provide a signal integration scheme for determining the capture of randomly occurring signal bursts.

Still another object of this invention is to use digital signal integration for setting the gain of the input signal amplifier that yields a measurement dynamic range greater than previous laser velocimeter signal processors.

A still further object of this invention is to use a digital filter bank to determine the frequency of the measured signal burst.

Other objects and advantages of this invention will become apparent hereinafter in the specification and drawings.

SUMMARY OF THE INVENTION

The input of the signal processor is applied to an amplifier that has an automatic gain control. The output from the amplifier is converted to digital by a non-linear analog-to-digital converter (ADC). The output from the ADC is shifted into two shift registers with one receiving the most significant bits (MSB) from the ADC and the other receiving the least significant bits from the ADC. A signal integration circuit under the control of the bits shifted into and out of the MSB shift register determines when a signal burst has been captured by the shift registers. When a signal burst has been captured the data in the shift registers is transferred and processed by a bank of digital filters and other circuitry to determine the frequency in the signal burst. An automatic gain control under the control of the bits shifted into and out of both shift registers controls the gain of the input amplifier.

DETAILED DESCRIPTION OF THE INVENTION

Figure 1:
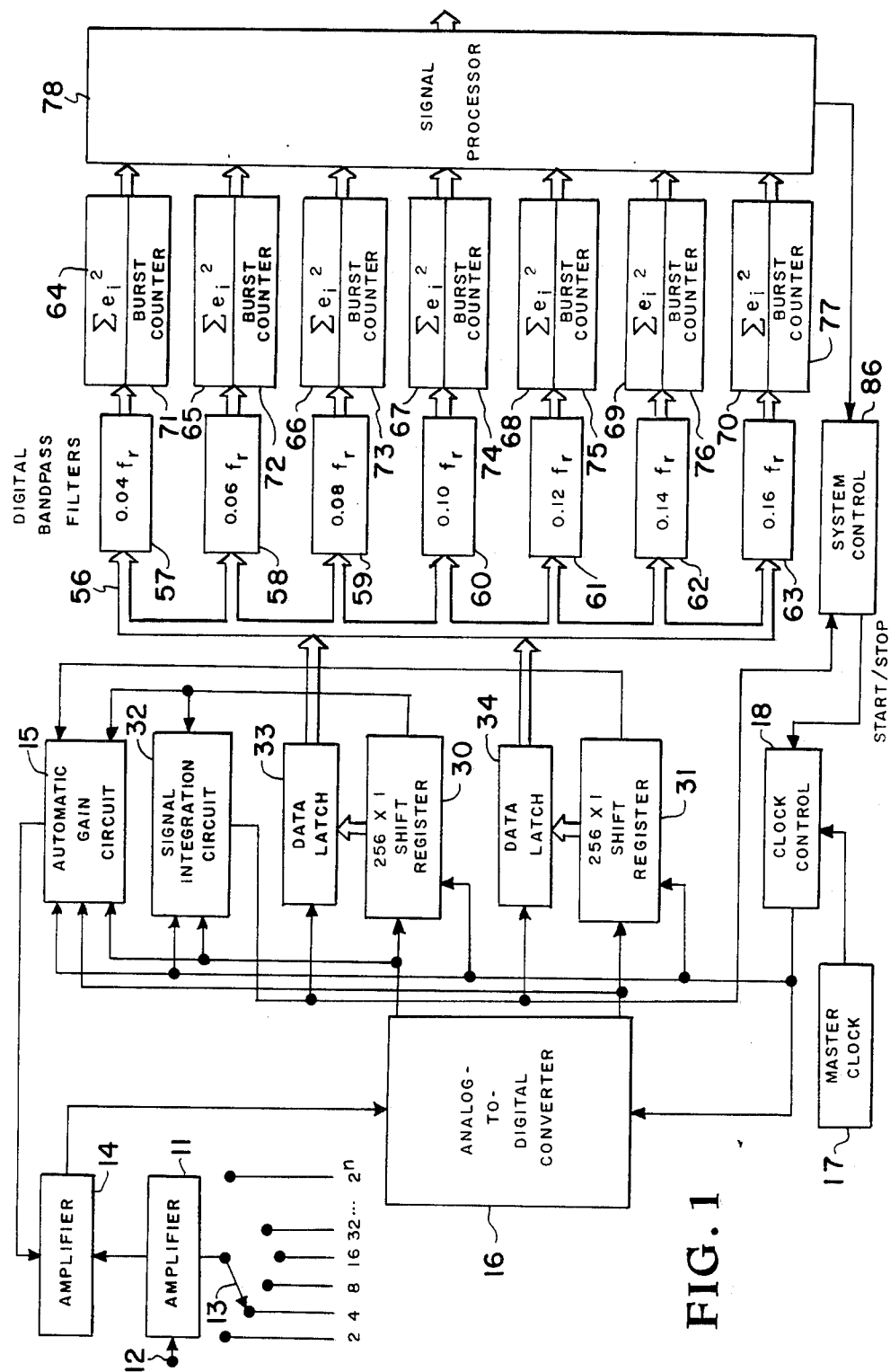
FIG. 1 is a block diagram of the invention.

Turning now to the embodiment of the invention selected for illustration in the drawings the number 11 in FIG. 1 designates an amplifier to which the input RF signal from a laser velocimeter is applied through an input terminal 12. Amplifier 11 includes a manual controlled switch 13 which can be set for a fixed gain of amplifier 11. The fixed gains are in a binary sequence, e.g., 2, 4, 8, 16, etc. Apparatus for providing this function will be obvious to one skilled in the art and is therefore not disclosed in detail in this application. The output of amplifier 11 is applied to an amplifier 14 which is provided with an automatic gain control by means of an automatic gain circuit 15 that is disclosed in detail in FIG. 3.

The output of amplifier 14 is applied to an analog-to-digital converter (ADC) 16 that is controlled by pulses from a master clock 17 through a clock control 18. Master clock 17 is several different crystals producing frequencies, for example, 1000 MHz, 800 MHz and 640 MHz. Clock control 18 is a switching circuit that can select either of the crystal frequencies or any $2_n$ division thereof. A system control 86, which can be a data latch, determines which frequency is used. Analog-to-digital converter 16 is designed to provide a digital representation of an input signal burst with resolution sufficient to preserve the frequency information and yield an indication of the signal amplitude. A signal burst has two structural components: a pedestal voltage due to the Gaussian light intensity profile of the laser beams, and an oscillating voltage due to the constructive and destructive interference between the two crossing laser beams yielding the fringe pattern. The signal amplitude at the output of the photomultiplier of a laser velocimeter can vary from single photon levels (typically 2 mV) to full saturation (typically 1.5 V). The amplitude ratio, $(V_{max}-V_{min})/(V_{max}+V_{min})$, between the oscillating voltage and the pedestal (signal visibility), can vary from unity down to zero depending on the particle light scattering characteristics and the configuration of the laser velocimeter optical system. Ideally, the seeding particles should be chosen and the optical system configured to yield visibility of unity, but typical systems may have visibilities down to 0.5.

If the signal bursts have a visibility of unity, the choice of the ADC comparator settings is virtually immaterial because each cycle of the waveform will go to zero. Therefore, a single bit ADC could be used, as in the photon correlator, to obtain the frequency information. Since amplitude information is desired for control of automatic gain circuit 15, a multi-bit ADC is used with the most significant value approximately one-fourth the photomultiplier saturation voltage. However, if the visibility is less than unity, it is very possible to obtain gaps in the digital representation of the waveform since the oscillations do not go to zero and may complete a cycle without crossing a comparator threshold. In an attempt to minimize this problem, a non-linear ADC is used which has the effect of compressing the waveform making the signal appear to have a greater visibility than a linear ADC. A two-bit ADC is used with comparator thresholds of 0.1, 0.2, and 0.4 V.

Figure 2:
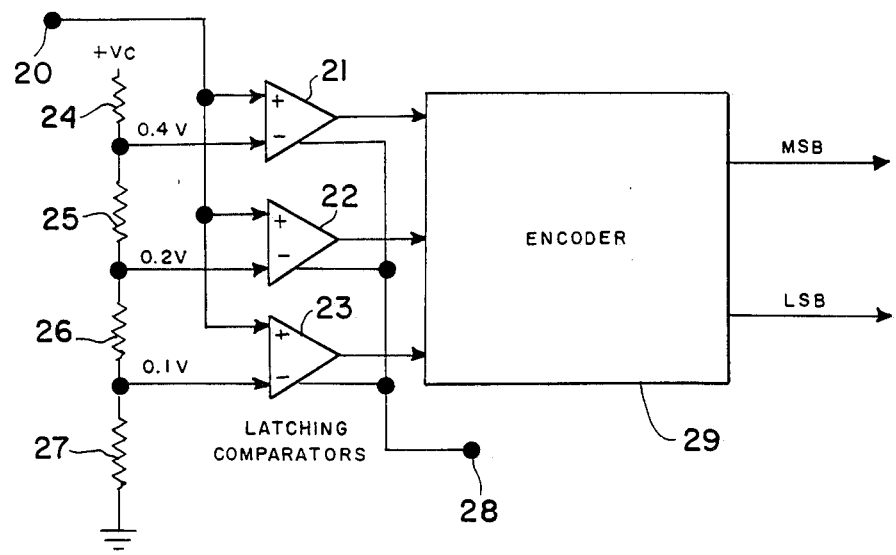
FIG. 2 is a schematic of the non-linear analog-to-digital converter.

A schematic of ADC 16 is shown in FIG. 2. The input signal from amplifier 14 is applied through an input terminal 20 to three latching comparators 21, 22, and 23. Resistors 24, 25, 26 and 27 are connected in series between a voltage $+V_c$ and ground and have values such that the voltage at the junction of resistors 24 and 25 is 0.4 V, connected to comparator 21, the 0.2 V is connected to comparator 22 and the 0.1 V is connected to comparator 23. The pulses from the clock control 18 are applied through a terminal 28 to comparators 21, 22, and 23. Each time a pulse is applied to the comparators they will produce a binary output of 000 if the input signal is less than 0.1 V, 001 if the input voltage is equal to or greater than 0.1 V and less than 0.2 V, 011 if the input voltage is equal to or greater than 0.2 V and less than 0.4 V and 111 if the input voltage is equal to or greater than 0.4V. The three binary bits at the outputs of comparators 21, 22 and 23 are encoded into two binary bits by means of an encoder 29. If the input to encoder 29 is 000, its output is 00; if the input is 001, its output is 01; if the input is 011, its output is 10; and if the input is 111, its output is 11. The upper output of encoder 29 is the most signficant bit (MSB) and the lower output of encoder 29 is the least significant bit (LSB).

The MSB and LSB from ADC 16 are applied to a 256×1 shift register 30 and a 256×1 shift register 31, respectively, as shown in FIG. 1. The output from ADC 16 is temporarily stored in shift registers 30 and 31. The data passes through the shift registers until a signal integration circuit 31 (disclosed in FIG. 3) has determined that a signal burst has been captured. The signal integration circuit 32 is controlled by the MSBs passing into and out of shift register 30. After a signal burst is captured the registers are clocked 54 further shifts to center the signal burst within the registers, then halts shifting to allow transfer to a data latch 23 and a data latch 34 by means of a signal from the signal integration circuit 32. This approach of data capture eliminates the need to continuously process the input signal (as the photon correlator) thus relaxing the speed of the data processing. The output from the signal integration circuit 32 also provides known points in time when particles pass through the laser velocimeter sample volume allowing time dependent statistics of the flow field to be obtained in a manner identical to data acquisition using the high-speed burst counter.

The effect of sampling rate/length on measurement accuracy was determined using 128-bit, 256-bit, and 512-bit shift registers sampling an input signal of twenty cycles with the sampling rate set for the burst to occupy approximately eighty percent of the register. As expected, the higher sample rates (20 data points per cycle vs 10 vs 5 for the 512, 256 and 128-bit registers, respectively) yielded greater measurement accuracies. Since satisfying the design requirement for input signal frequencies up to 100 MHz the 512-bit shift register would require a sampling frequency of 2.0 GHz, the signal processor is designed using a limit of 1.0 GHz to ease system complexity thus setting the shift register length to 256-bits.

Although the components of the ADC 16 must be high speed (1.0 GHz), the speed requirements of the shift registers 30 and 31 may be reduced by using decoders to operate several small shift register circuits in a parallel scheme. This technique is possible since electronic logic circuit normally trigger on the edge of a clock pulse and the required stabilization time for the circuit is obtained by passing the next clock pulse to another circuit.

Figure 3:
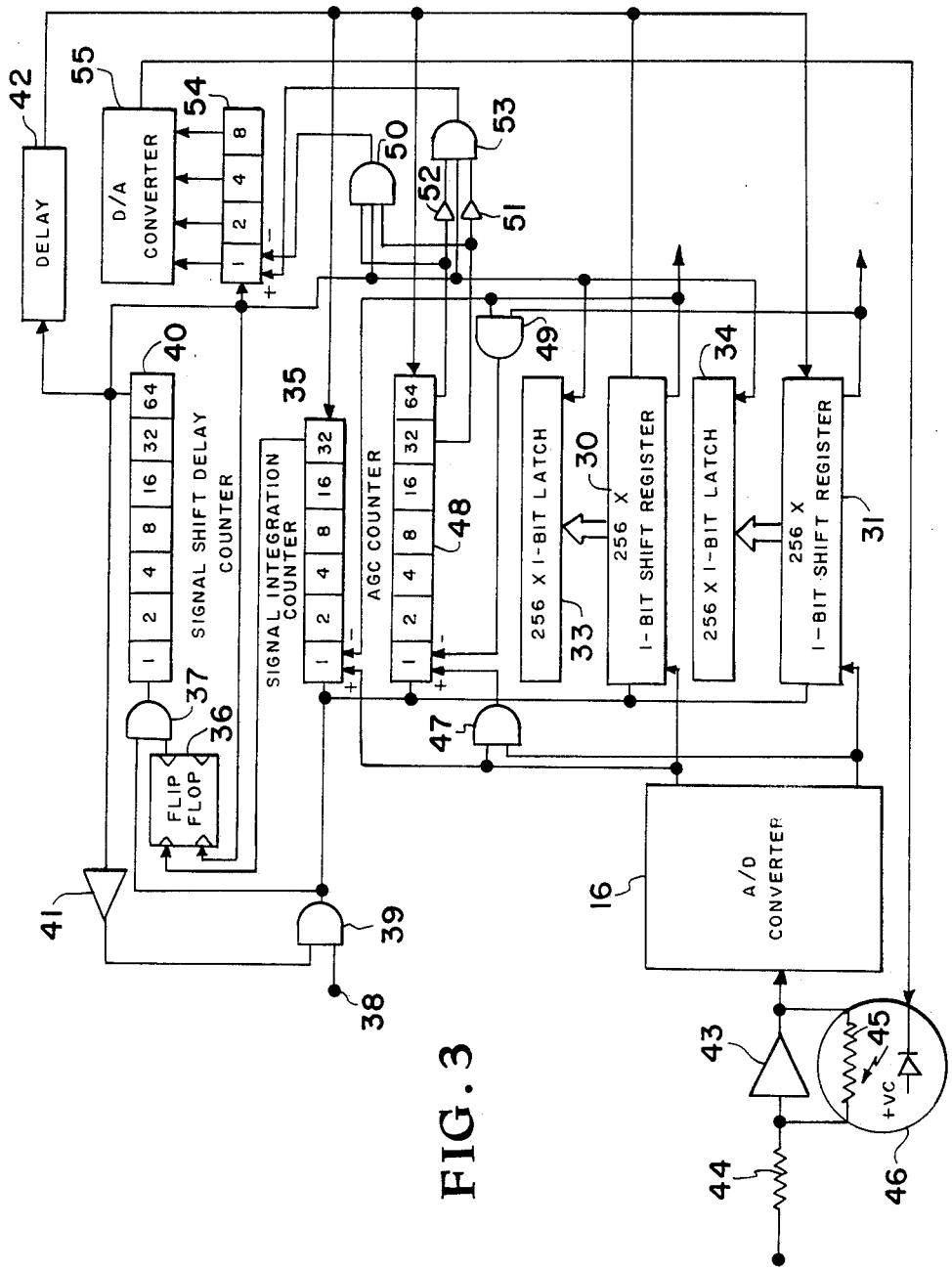
FIG. 3 is a schematic of the signal integration circuit and the automatic gain circuit.

Signal integration circuit 32 determines if a signal burst is contained within the shift registers 30 and 31. In this circuit a signal integration counter 35, as shown in FIG. 3, receives the MSBs shifted into register 30 and the MSBs shifted out of register 30. Each time a binary "1" is shifted into register 30, counter 35 counts up one and each time a binary "1" is shifted out of register 30, counter 35 counts down one. Whenever the count in counter 35 reaches 32, the burst detect threshold, a signal is sent to a flip flop 36 thereby changing its state. Flip flop 36 normally applies a binary "0" to an AND gate 37. A signal from counter 35 causes flip flop 36 to apply a binary "1" to gate 37. The pulses from the clock control 18 are applied through a terminal 38 and an AND gate 39 to signal integration counter 35 and to gate 37. The pulses passed through gate 37 are counted by a signal shift delay counter 40. Whenever the count in counter 40 is less than 64, the output of the counter is a binary "0" which is converted to a binary "1" by an inverter 41 which is applied to gate 39 thereby allowing the pulses from the master clock 17 to pass through gate 39.

Whenever the count in signal integration counter 35 reaches 32, the burst detect threshold, indicating that a burst has been captured by shift registers 30 and 31, the signal from counter 35 changes the state of flip flop 36 thereby allowing the pulses from the master clock to pass through gate 37 to counter 40. Therefore, when the count of counter 40 reaches 64, a signal is sent to data latches 33 and 34 causing them to latch the data contained in shift registers 30 and 31. In addition, the signal from counter 40 is applied to flip flop 36 causing it to change states thereby blocking the pulses applied to gate 37; the signal is inverted by inverter 41 thereby blocking the pulses applied to gate 39; and the signal is applied to signal integration counter 35 to change the count in counter 35 to zero. The output of counter 40 is delayed by a delay 42 to allow shift registers 30 and 31 sufficient time to transfer their data to the data latches; the delayed signal is used to clear the shift registers 30 and 31, and the counter 40. The circuit is then ready to capture another signal burst.

It is necessary to use only the pulse trains entering and exiting the MSB shift register 30 for the controlling signals to the signal integration circuit since the gain control circuitry will keep the background noise levels below the MSB threshold (in this case 0.2 volts) while the measured signals will be above. Simulation test results to date have verified the circuit operation with signals containing as few as seventy photons per burst. A burst detect threshold of thirty-two was chosen because it provides a convenient binary value from the counter 35 while allowing for signals of sixty percent higher frequency (three standard deviations of maximum deviation) to be detected.

As disclosed above, the signal processor contains two controls for amplification of the input signal level. The first is a manual switch 13 for setting fixed gain ranges of amplifier 11 in a binary sequence, e.g., 2, 4, 8, 16, etc. The second is the automatic gain circuit 15 which provides gain control of amplifier 14 within the confines of the manual control setting of switch 13. For example, if the manual switch 13 is set for a gain of 4, the range of the AGC 15 will provide overall gain down to a gain of 2 and up to a gain of 8. Total automatic gain is not used because of the possibility of amplifying noise levels which would trigger the signal integration circuit 32. Front panel indicators (not shown) are used to show when the AGC circuit is operating at either the minimum or maximum gain settings allowing the user to adjust the manual gain switch 13 to the proper setting.

The two amplifiers 11 and 14 are arranged in series to obtain the necessary signal gain for optimal signal detection and processing. The manually controlled amplifier 11 is set to have one-half the amplification level as shown by the switch 13 setting, e.g., a setting of 4 will yield an actual gain of 2. If the automatic gain controlled amplifier 14 is allowed to vary its amplification from a gain of 1 to a gain of 4, the total desired range is obtained, e.g., a gain of 2 to a gain of 8 for a switch 13 setting of 4.

Amplifier 14, as shown in FIG. 3, includes an amplifier 43 with an input resistor 44 and a feedback resistor 45. Resistor 45 is a photoresistor whose resistance varies in accordance with the light directed onto the resistor. A light emitting diode 46 connected to a voltage $+V_c$ is located in the vicinity of resistor 45 to automatically vary the resistance of resistor 45 and thereby automatically varying the gain of amplifier 43.

In the automatic gain control circuitry, the MSB and LSB out of ADC 16 are "and" together by an AND gate 47 the output of which is applied to ACG counter 48 to count up when both are binary "1"s. The MSB and LSB out of shift registers 30 and 32 are "and" together by an AND gate 49 the output of which is applied to counter 48 to count down when both are binary "1"s. The outputs of the stages of counter 48 indicating counts of 32 and 64 are applied to an AND gate 50 and are inverted by inverters 51 and 52, respectively, and then applied to an AND gate 53. The output of gate 50 is applied to a four stage binary counter 54 to count down when a binary "1" appears at the output of gate 50. The output of gate 53 is applied to counter 54 to count up when a binary "1" appears at the output of gate 53. The output of counter 40 is applied to counter 54 and gates 50 and 43. Consequently, each time counter 40 produces an output signal (a binary "1") counter 54 counts up one if the count in counter 48 is less than 32, counter 54 neither counts up or down if the count in counter 48 is between 32 and 95 inclusive, and counter 54 counts down one if the count in counter 48 is 96 or greater. The binary outputs of counter 54 are converted to an analog signal by a digital-to-analog converter 55. This analog signal controls the light emitting diode 46.

The 4-bit gain control counter 54 adjusts the variable gain amplifier 14 from a gain of 1 (count of 0) to a gain of 4 (count of 15). This scheme provides adjustment of gain based only on the peak voltage levels of the signal bursts and not the average voltage levels over time which can be affected by background noise. The use of amplification increments of 0.1875 results in a slow feedback loop so that the gain control follows trends in signal strength and not instantaneous signal amplitude fluctuations.

Once the transfer of the digitized signal burst to the latches 33 and 34 is completed, the data are sent via a common bus 56 to a parallel bank of seven elliptic digital bandpass filters 57, 58, 59, 60, 61, 62 and 63. These filters are fixed as specified fractions of the reference clock frequency. By adjusting the reference clock (clock control 18), signal frequencies up to 100 MHz will pass energies through the filter bank. The filter characteristics are thus fixed in a relative sense, i.e., fixed fractions of the reference clock frequency, while the signal frequency measurement range is established in an absolute sense, by the limits of the reference clock and front end circuitry.

The center filter 60 is set to ten percent of the reference clock frequency to yield a resolution of ten samples per cycle for the average frequency. The remaining filters are set for ±1, 2 and 3 design standard deviations (f'/F = 20 percent) about the center filter. These conditions result in filters with central $f_c/f_r$ = 0.04, 0.06, 0.08, 0.10, 0.12, 0.14 and 0.16 and with approximately 40 percent overlap. The elliptic design was chosen because it yields the sharpest cutoffs and flatest pass bands yet requires the fewest computations of the standard filter types. The outputs of the filters are passed through square law detectors 64, 65, 66, 67, 68, 69 and 70, and burst counters 71, 72, 73, 74, 75, 76 and 77 to a signal processor 78.

Figure 4:
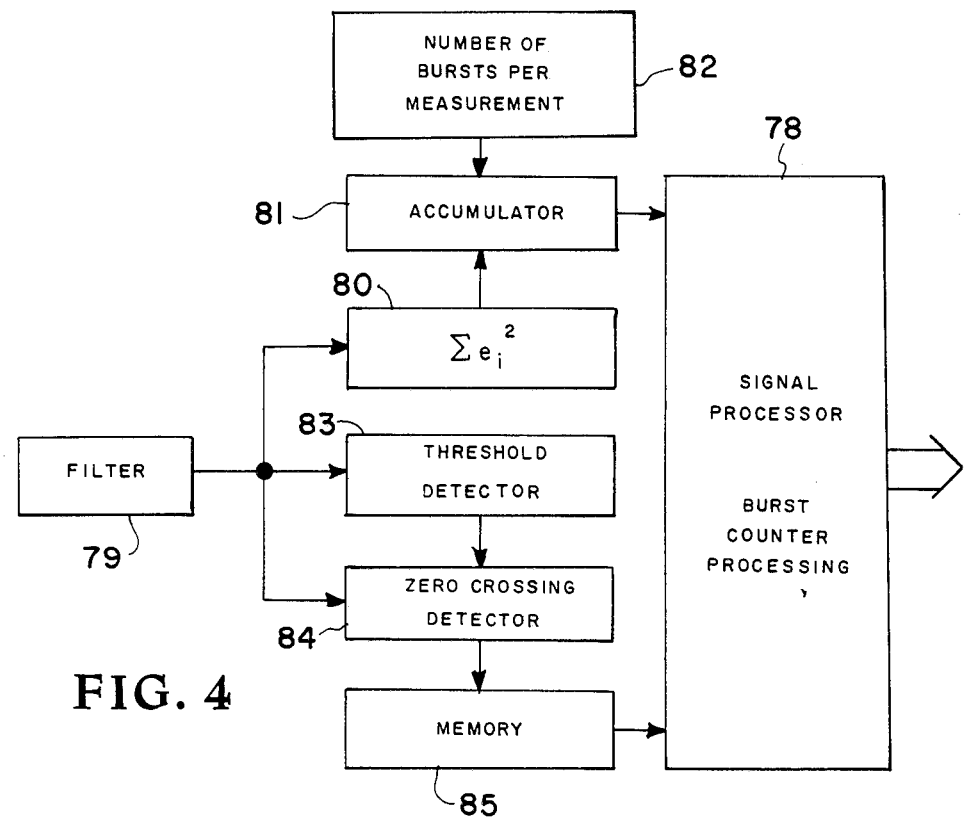
FIG. 4 is a block diagram showing how the digital data is processed after it has passed through the filter bank.

One of the square law detectors-burst counter combinations is disclosed in FIG. 4. The output from one of the filters 79 is measured by a square law detector 80 and stored in the detector accumulator 81 which may be set to accumulate energy measurements from 1 to n signal bursts as determined by front panel setting 82. If the energy measurements are from a single frequency burst (when the accumulator is set to 1 signal burst), the oscillation frequency contained within that burst may be determined. If the accumulator is set for more than one signal burst, the resulting frequency measurement is the average frequency for n bursts. This is useful in situations of low signal-to-noise ratio conditions and in laminar flow measurements when statistical jitter within the energy histogram will add unacceptable residual f'/F.

In the burst counter position of FIG. 4, a threshold detector 83 detects negative values from filter 79 and arms a zero crossing detector 84. Hence detector 84 detects zero crossings with positive slopes. When a zero crossing is detected, the exact location is determined by straight line interpolation between the last negative value and the first positive value. Each zero crossing location (interpolated shift register address) is then stored in a memory 85.

The output from each of the seven filters is passed through its own burst counter to determine the locations of the zero crossings within the filtered signal, and its own square law detector to determine the magnitude of signal energy passing through the filter. When the signal burst has completely passed through the filter bank, burst counters and energy detectors, the detectors are interrogated by signal processor 78 to determine which filter passed the greatest energy. The burst counter memory for that filter is interrogated to find the third and n-2 (where n is the number of measured zero crossings) zero crossing location for the calculation of signal frequency, $f_s$, divided by the reference frequency, $f_r$ ($f_s/f_r$). The first and last two zero crossings are deleted to minimize end effects from discontinuities at the limits of the stored signal. Signal processor 78 is a computer which performs the burst counting processing that is well known in the art.

The burst counter technique for processing the data from the filter bank works well when f'/F is greater than five percent. However, this technique does not allow multi-burst integrations for increasing signal-to-noise ratio of photon resolved signals and for measurements of laminar flow fields. If f'/F is less than five percent the filters are placed closer together further increasing the output signal-to-noise. These new filters use the same seven circuit elements described previously by dynamically loading the proper filter coefficients into the hardware. The design dynamically reconfigures the filter bank with one of three sets of filter coefficients, again with approximately forty percent overlap, with the center frequencies: Bank 1—0.064, 0.068, 0.072, 0.076, 0.080, 0.084 and 0.088; Bank 2—0.076, 0.080, 0.084, 0.088, 0.092, 0.096 and 0.10; Bank 3—0.088, 0.092, 0.096, 0.10, 0.104, 0.108 and 0.112. With these filters in place the signals from the filters can be processed by either the burst counter technique discussed above or the energy integration method. In the energy integration method only the outputs from the accumulators 81 are processed by the signal processor 78. The signal frequency is determined by curve fitting the energy levels (peak energy level ± next filter output) and determining the peak value.

TYPICAL SYSTEM OPERATION

The frequency domain laser velocimeter signal processor is designed to have two phases of operation. The first phase is the instrument setup phase where the reference clock frequency and filter selection are established, and the second is the data acquisition phase. As an illustration of the operation of the system, the following example is presented for a series of signal bursts.

When a velocity measurement is desired, the external data acquisition system issues a command control (trigger) pulse to the system control 86. The system control interprets this pulse as a begin data acquisition control and sets the reference clock to 1.0 GHz, loads the digital filter bank with the parameters to accept an f'/F of 20 percent, activates the burst counter signal processor (provided the number of bursts per measurement is set to unity, if not the energy detection signal processing is activated), and acquires the first signal frequency to reference frequency ($f_s/f_r$) determined. If the ratio is less than 0.08, the reference clock frequency is lowered by 20 percent (equal to the frequency separation between adjacent filters) and the next signal burst acquired. This process is repeated until either the AGC circuit reaches a limit or the ratio is greater than 0.08. If the AGC circuit reaches a limit, the processor halts until the manual gain control is adjusted, the reference clock then resets to 0.1 GHz and the process repeated. If $f_s/f_r$ is greater than 0.08, the reference clock frequency is locked.

To ensure that the system control has locked the reference clock at a frequency to obtain center the average signal frequency within the filter bank, signals from the next ten particles are measured and the average $f_s/f_r$ calculated. If the ratio is less than 0.08, the reference clock is lowered twenty percent and signals from the next ten particles acquired and the check repeated. If the ratio is greater than 1.2, the reference clock is raised twenty percent and the process repeated. This procedure is necessary because if f'/F is large, the original clock setting procedure may have been set by a signal frequency at the extreme of the frequency distribution resulting in an incorrect choice of reference clock frequency. When the ratio is found to be above 0.08 but below 1.2, the coded value for the reference clock frequency is placed on the output bus and passed as the first data word to the external data acquisition system.

The setup of the processor then continues by measuring the signal frequencies from the next thirty particles and calculating the mean and standard deviation of the ensemble. If the measured f'/F is less than 5.0 percent, the coefficients for a set of narrow bandpass filters (set chosen based on the measured mean signal frequency), is loaded into the filter bank and the burst counter signal processing turned off and the energy detect signal processing activated. When the coefficients, if required, are loaded into the filter bank circuitry, the setup phase is completed with the transfer of the reference clock frequency value to the external data acquisition system.

When the next signal burst is acquired beginning the data acquisition phase, the control pulse from the signal integration circuit triggers a fixed time delay counter to allow sufficient time for the signal to be processed and the result placed on the output bus for transfer to the external data acquisition system and the system triggered. The data acquisition cycle repeats until a command control pulse fails to arrive from the data acquisition system within the system control reset time (for example 10 msec) following the issue of the control pulse from the signal integration circuit. The failure of the arrival of the command control pulse is interpreted by the system control to be an end-of-data-acquisition condition. The receipt of the next command control pulse will begin a new data acquisition cycle beginning with the setup phase. Following the completion of the data acquisition phase, the external data acquisition system contains a data array with the first word being the value of the reference clock frequency and the second and remaining words consisting of the measured signal frequencies as fractions of the reference clock frequency.

The external computer system completes the data acquisition process by converting the measured frequency fractions to absolute frequency values by a multiplication of the data with the value of the reference clock frequency. Interarrival times, time between adjacent signal bursts used for turbulence power spectra measurements, are obtained by measuring the time between the command pulses from the signal integration circuit (output bus flag pulses) by the external data acquisition system. Therefore, the same data acquisition scheme presently used for high-speed burst counter measurements is maintained with the frequency domain laser velocimeter signal processor.

PHOTON RESOLVED AND LAMINAR FLOW SIGNAL PROCESSING

If the signals from the laser velocimeter are photon resolved due to optical system limitations, the frequency domain laser velocimeter signal processor may still be used to determine the average signal frequency and an estimate of the higher order statistics. The system is run with the filter accumulators set for integrating more than one signal burst and the energy distribution signal processing technique used. The narrow filter banks are used to obtain the maximum measurement accuracy of the mean. Accuracy in the measurement of f'/F is not considered because the averaging of the signal bursts will in effect low pass filter the turbulence portion of the data in a random manner dependent upon the data rate. The measured f'/F is to be considered as an indication of turbulence only. This operation equates to the measurement of photon resolved signals by the photon correlator.

This technique can also be used with high level signals to increase signal-to-noise ratio for a better estimate of f'/F in near laminar flow fields. This estimate will be accurate provided the data rate is sufficiently high where data averaging does not affect the frequency content of the turbulence. This assumption can generally be made in laminar flow situations.

A new laser velocimeter frequency domain signal processor has been presented that provides the same or better accuracy than current laser velocimeter signal processing techniques without operator intervention. The new signal processor is a "smart" instrumentation system which determines its proper operating parameters from the signals themselves and reconfigures itself to optimize measurement accuracy. The system provides the same measurement capabilities as the high-speed burst counter in instantaneous measurements of signal frequency, the same automatic gain control and automatic frequency control as the frequency tracker, and the same immunity to signal-to-noise derived errors as the photon correlator.

Simulation results have shown residual values of f'/F to be 0.2 percent, a factor of 2.5 below a high-speed burst counter. Above this level (actually above 1.0 percent when the high-speed burst counter becomes accurate), the signal processor has the same accuracy as the high-speed burst counter up to an f'/F of 20 percent without the subjective setting of bandpass filters as required by the counter. The simulation results show accurate measurements from signals with average photon counts per burst down to 150 photons, and with multiple bursts per measurement (simulation example was five bursts), down to the photon resolved region of 60 photons per burst (an average of three photons per cycle for the 20 cycles per burst).

What is claimed is:

1. A method of processing a succession of random output burst signals from a laser velocimeter to measure an oscillation frequency within each of said random output burst signals comprising the steps of:
   converting at a sequence of times with short time intervals each of said random output burst signals from said laser velocimeter to a number L of parallel digital bits forming a pulse train representing the amplitudes of each of said random output burst signals at each of said respective sequences of time;
   serially storing a number of bits M from each of said pulse trains of L parallel digital bits;
   detecting and sensing from the number of M bits entering said storage when a random output burst signal is contained within storage;
   transferring out of storage the said number of M stored bits when a random output signal is detected within storage; and
   processing the transferred number of M bits to measure the oscillation frequency within each of said detected random output burst signals prior to processing a next succeeding random output burst signal.

2. A method according to claim 1 wherein said number L of parallel digital bits is two parallel digital bits where one is the most significant bit and the other is the least significant bit.

3. A method according to claim 2 wherein the detection of a random output signal burst in storage occurs only in response to the most significant bits.

4. A method according to claim 1 including the step of amplifying the output signal from the laser velocimeter before it is converted to said number L of parallel digital bits.

5. A method according to claim 4 wherein said amplifying step comprises the step of amplifying the output signal from the laser velocimeter by an amount $2^n$ where $n = 1, 2, 3 \ldots$, and then automatic gain control amplifying the signal between the amounts $2^{n-1}$ and $2^{n+1}$.

6. A method according to claim 5 wherein the step of automatic gain control amplifying is under the control of the detecting step and the number of M bits entering and leaving storage.

7. A method according to claim 1 wherein the step of storing a number M of each L parallel bits is accomplished by the number L of $M \times 1$ shift registers.

8. A method according to claim 7 wherein the step of converting each of said random output burst signals from said laser velocimeter to a number L of parallel digital bits representing the amplitudes of each of said random output burst signals includes the steps of comparing the input signal with $2^L - 1$ preselected levels and converting the number of preselected levels equaled or exceeded to L parallel digital bits.

9. A method according to claim 8 wherein said preselected levels are non-linear such that the difference between the highest two of the preselected levels is greater than the differences between any other two consecutive levels thereby reducing the occurrences of missing cycles during digitization of each random output burst signal with low visibility.

10. A method according to claim 9 wherein said step of processing the number M of transferred bits to obtain the oscillation frequency within the random output burst signal comprises the steps of filtering the number M of transferred bits with a plurality of bandpass filters and processing the outputs from all of the several bandpass filters to obtain the oscillation frequency of each of said random output burst signals.

11. A method according to claim 10 wherein said step of processing the outputs from all of the several bandpass filters comprises individually processing each of the several outputs from each of said plurality of bandpass filters and further processing the individually processed outputs therefrom to measure the oscillation frequency within each of said detected random output burst signals.

12. A method according to claim 11 wherein the step of individually processing each of said plurality of outputs comprises the step of measuring the energy level from each of said outputs and the step of further processing comprises determining the oscillation signal frequency by curve fitting the energy levels of said individually processed outputs and determining the peak value.

13. A method according to claim 11 wherein the step of individually processing each of said plurality of outputs comprises the steps of measuring the level from each of said outputs and locating the zero crossings and the step of further processing comprises selected the one of said outputs having the greatest energy and using this output and its zero crossings to determne the oscillation signal frequency.

14. Apparatus for processing a succession of random output burst signals from a laser velocimeter and measuring the oscillation frequency within each of said random output burst signals comprising:
   analog-to-digital converter means for receiving and converting at a sequence of times with short time intervals each of said random output burst signals from said laser velocimeter to a number L of parallel digital bits representing the amplitudes of each of said random output burst signals at each of said time sequences;

a number L of Mx1 digital shift register means for storing a number M of each of said L parallel bits;

means, under the control of the bits entering and leaving said shift register means for detecting when a random output burst signal is contained within said shift registers and for transferring out of the shift registers the said M bits stored therein whenever a random output signal burst is detected; and means for processing the transferred M bits to measure the oscillation frequency within said detected random output burst signal prior to receiving the next of said succession of random output burst signals.

15. Apparatus according to claim 14 wherein said number L of parallel digital bits is two parallel digital bits M where one is the most significant bit and the other is the least significant bit with each stored in its own shift register.

16. Apparatus according to claim 15 wherein said means for detecting when a random output burst signal is contained within said shift register means is under the control of only the most significant bits M shifted into and out of the most significant bit shift register means.

17. Apparatus according to claim 16 wherein said means for detecting when a random output burst signal is contained within said shift register means includes a counter means for counting up and counting down when the most significant bits M are shifted into and out of said most significant bit shift register means and means in response to a signal from said counter means when the counter means reaches a predetermined count for transferring the bits M stored in said shift register means out of said shift register means.

18. Apparatus according to claim 17 wherein said means in response to a signal from said counter means includes means for delaying said signal so that the bits M stored in said shift register means can be centered in the shift register means before they are transferred.

19. Apparatus according to claim 14 wherein said analog-to-digital converter means includes several comparator means for comparing the input signal with several amplitude levels and means for converting the outputs of said comparator means into L parallel digital bits.

20. Apparatus according to claim 19 wherein the comparing amplitudes of said several comparator means are non-linear thereby reducing the occurrences of missing cycles during digitization of random output burst signals with low visibility.

21. Apparatus according to claim 14 including amplifier means for amplifying the output signal from said laser velocimeter before it is applied to said analog-to-digital converter.

22. Apparatus according to claim 21 wherein said ampalifier means includes a fixed gain amplifier means with a selected gain of $2^n$ where n=1, 2, 3, ... and an automatic gain control amplifier means connected in series with said fixed gain amplifier for varying the gain of the combination between $2^{n<1}$ and $2^{n+1}$.

23. Apparatus according to claim 22 wherein said automatic gain control means comprises an automatic gain control counter under the control of the bits shifted into and out of said shift register means and means under the control of the count within said automatic gain control counter for varying the gain of said automatic gain control amplifier.

24. Apparatus according to claim 23 wherein said means for varying the gain of said automatic gain control amplifier comprises a gain counter, means under the control of the count in said automatic gain control counter for changing the count in said gain counter, means for converting the count in said gain counter to an analog signal and means responsive to said analog signal for varying the gain of said automatic gain control amplifier means.

25. Apparatus according to claim 14 wherein said means for processing the transferred bits M comprises a parallel bank of several digital filters with all of said transferred bits M passing through each of said several digital filters and means connected to the outputs of said filters for measuring the oscillation frequency within the transferred signal burst.

26. Apparatus according to claim 25 wherein said means connected to the outputs of said filters for determining the oscillation frequency of the signal within the transferred signal burst comprises means for measuring the energy level from each of the filters and signal processor means for determining the oscillation frequency by curve fitting the energy levels and determining the peak value.

27. Apparatus according to claim 25 wherein said means connected to the outputs of said filters for determining the oscillation frequency within the transferred signal burst comprises means for measuring the energy levels from said filters and for locating the zero crossings and signal processor means for selecting the largest energy level and its zero crossings for measuring the oscillation frequency of each of said detected random output burst signals.

* * * * *